United States Patent
Gill

(10) Patent No.: US 7,606,007 B2
(45) Date of Patent: Oct. 20, 2009

(54) SHIELD STABILIZATION FOR MAGNETORESISTIVE SENSORS

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 437 days.

(21) Appl. No.: 11/357,513

(22) Filed: Feb. 17, 2006

(65) Prior Publication Data

US 2007/0195467 A1    Aug. 23, 2007

(51) Int. Cl.
G11B 5/39    (2006.01)
G11B 5/11    (2006.01)

(52) U.S. Cl. .................. 360/319; 360/322

(58) Field of Classification Search .............. 360/319, 360/324.1, 324.11, 324.12, 324.2, 322
See application file for complete search history.

(56) References Cited

U.S. PATENT DOCUMENTS

| | | | |
|---|---|---|---|
| 4,103,315 A | 7/1978 | Hempstead et al. | |
| 5,515,221 A | 5/1996 | Gill et al. | |
| 5,621,592 A | 4/1997 | Gill et al. | |
| 6,275,360 B1 * | 8/2001 | Nakamoto et al. | 360/319 |
| 6,358,635 B1 | 3/2002 | Min et al. | |
| 6,437,949 B1 | 8/2002 | Maken et al. | |
| 6,456,467 B1 | 9/2002 | Mao et al. | |
| 6,462,641 B1 | 10/2002 | Dieny et al. | |
| 6,496,335 B2 | 12/2002 | Gill | |
| 6,567,299 B2 * | 5/2003 | Kunikiyo et al. | 365/173 |
| 6,654,209 B2 | 11/2003 | Seigler et al. | |
| 6,710,982 B2 * | 3/2004 | Mack et al. | 360/319 |
| 6,731,474 B2 | 5/2004 | Terunuma et al. | |
| 6,801,409 B2 * | 10/2004 | Michel et al. | 360/319 |
| 6,819,530 B2 | 11/2004 | Gill | |
| 6,826,022 B2 * | 11/2004 | Umetsu | 360/324.12 |
| 6,831,816 B2 | 12/2004 | Gill | |
| 6,929,957 B2 * | 8/2005 | Min et al. | 438/3 |
| 6,967,823 B2 * | 11/2005 | Nakamoto et al. | 360/319 |
| 7,154,713 B2 * | 12/2006 | Watanabe et al. | 360/313 |
| 2002/0034054 A1 * | 3/2002 | Michel et al. | 360/319 |

(Continued)

FOREIGN PATENT DOCUMENTS

JP    5002720    1/1993

(Continued)

OTHER PUBLICATIONS

Carey, et al, 2002 American Institute of Physics, Dec. 30, 2002, *Improved corrosion resistance of IrMn by Cr and Ru additions*, pp. 5198-5200.

*Primary Examiner*—Jefferson Evans
(74) *Attorney, Agent, or Firm*—Patterson & Sheridan, L.L.P.

(57) ABSTRACT

Apparatus and method for providing a magnetic head that includes a magnetoresistive read sensor disposed between first and second magnetic shields. The shields are configured to reduce protrusion of the shields from a polished flat air bearing surface of the magnetic head upon increases in temperature. This configuration for the shields therefore at least reduces differences in thermal expansion of the shields relative to other parts of the magnetic head forming the air bearing surface. These shields according to some embodiments include one or more ferromagnetic layers exchange coupled with an antiferromagnetic layer. Further, in a particular embodiment, all the ferromagnetic layers within each of the shields can have a combined thickness per shield of less than 500 angstroms.

20 Claims, 4 Drawing Sheets

U.S. PATENT DOCUMENTS

| | | | |
|---|---|---|---|
| 2002/0064002 A1* | 5/2002 | Gill | 360/319 |
| 2003/0117749 A1* | 6/2003 | Shukh et al. | 360/317 |
| 2006/0002020 A1* | 1/2006 | Pokhil et al. | 360/126 |
| 2006/0164759 A1* | 7/2006 | Okada et al. | 360/126 |

FOREIGN PATENT DOCUMENTS

| | | |
|---|---|---|
| JP | 6084144 | 3/1994 |
| JP | 9069211 | 3/1997 |
| JP | 2002/298314 | 10/2002 |

* cited by examiner

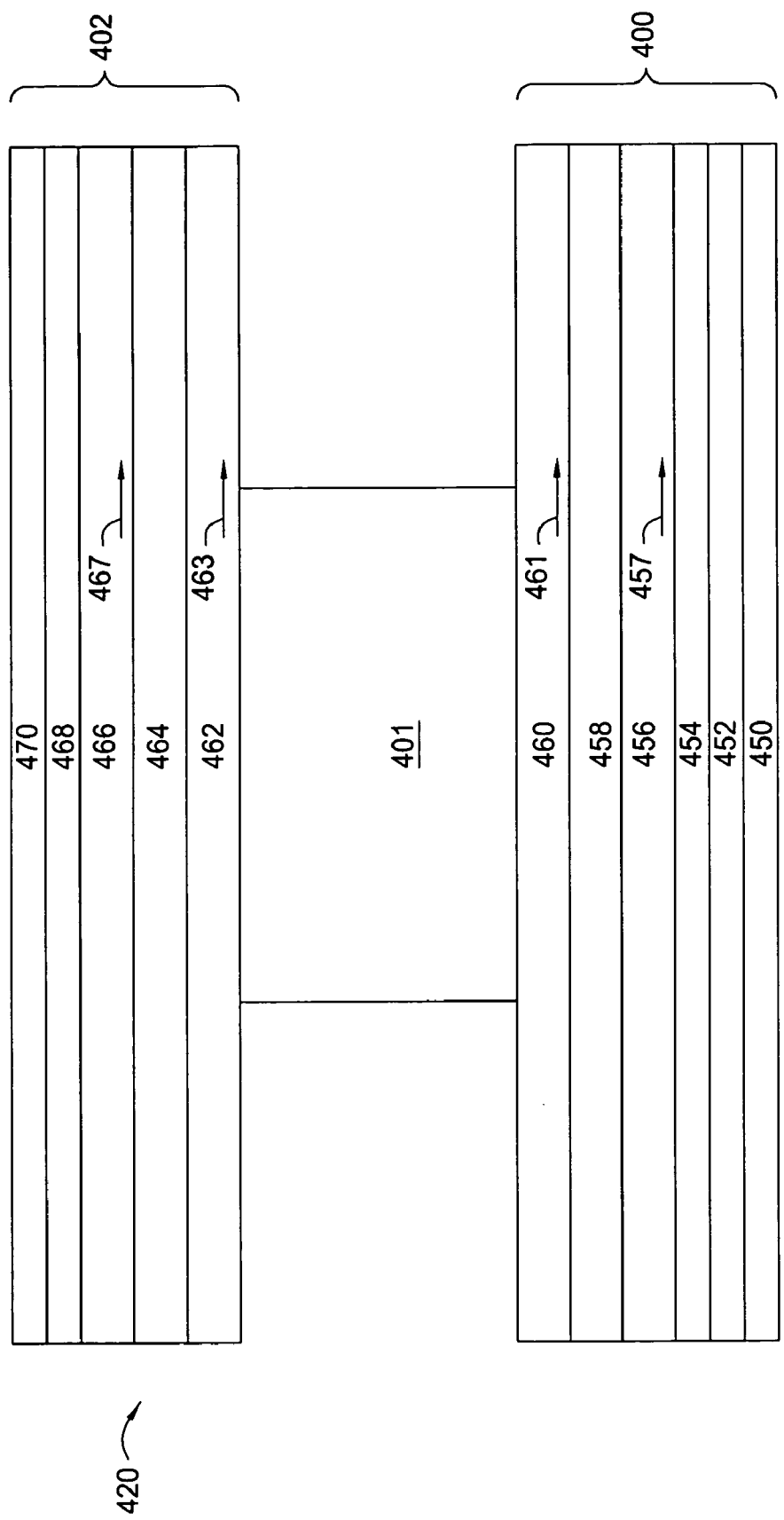

SHIELD STABILIZATION FOR MAGNETORESISTIVE SENSORS

BACKGROUND OF THE INVENTION

1. Field of the Invention

Embodiments of the invention generally relate to electronic data storage and retrieval systems having magnetic heads capable of reading recorded information stored on magnetic media.

2. Description of the Related Art

In an electronic data storage and retrieval system, a magnetic head typically includes a reader portion having a magnetoresistive (MR) sensor for retrieving magnetically-encoded information stored on a magnetic recording medium or disk. The MR sensor operates based on a change of electrical resistivity of certain materials of the MR sensor in the presence of a magnetic field. During a read operation, a bias current is passed through the MR sensor. Magnetic flux emanating from a surface of the recording medium causes rotation of a magnetization vector of a sensing layer of the MR sensor, which in turn causes the change in electrical resistivity of the MR sensor. Since a voltage across the MR sensor is equal to the bias current that is supplied times the resistivity, the change in electrical resistivity of the MR sensor can be detected by measuring a voltage across the MR sensor to provide voltage information that external circuitry can then convert and manipulate as necessary.

To efficiently read data from a data track of the recording medium, the MR sensor of the magnetic head must be shielded from extraneous magnetic fields, such as those generated by a write head or adjacent data tracks. Accordingly, the MR sensor is sandwiched between a pair of magnetic shields within the read head portion. During the read operation, first and second read shields ensure that the MR sensor reads only the information stored directly beneath it on a specific track of the recording medium by. absorbing any stray magnetic fields.

Each of the shields typically includes one or more layers of ferromagnetic materials such as a nickel iron alloy. The ferromagnetic materials within the shields possess high coefficients of thermal expansion relative to most other materials in the magnetic head. Further, the amount of thermal expansion of the shields occurs proportionally to the volume of the shield, especially since a bulk of the volume is typically the ferromagnetic materials. The MR sensor is relatively small in volume compared to the shields. Consequently, an expansion differential occurs between the MR sensor and the shields as the temperature of the magnetic head increases. Specifically, the shields experience relatively more expansion than the MR sensor with increasing temperature. The difference in expansion results in the MR sensor becoming recessed along an air bearing surface of the magnetic head relative to the protruding shields at the air bearing surface. This recessing of the MR sensor due to thermal expansion of the shields adversely effects separation of the MR sensor from the recording medium resulting in increased read errors.

A contributing factor to the problem of shield expansion is that the shields conforming to conventional structures utilize thickness of the layers of the ferromagnetic materials to maintain a magnetic stiffness desired. Ensuring shield magnetic stability avoids non-linear response of the MR sensor and increases in write induced instability/popcorn noise. The magnetic stiffness of the shields according to prior configurations for the shields decreases with a reduction in thickness of the shields. Accordingly, this thickness of the ferromagnetic materials adds to the volume of the shields, thereby contributing to relatively large thermal expansion of the shields.

Therefore, there exists a need for an improved shield structure that eliminates or reduces temperature dependent protrusion of the shield into a planar air bearing surface common with an end surface of an MR sensor.

SUMMARY OF THE INVENTION

In one embodiment, a magnetic head includes a non-magnetic insulating portion, a magnetoresistive read sensor, and a shield disposed adjacent the magnetoresistive read sensor. Additionally, the shield includes a ferromagnetic first layer, an antiferromagnetic second layer, and a non-magnetic third layer. The non-magnetic third layer can define an outermost layer of the shield in contact with the non-magnetic insulating portion.

According to a further embodiment, a magnetic head includes a non-magnetic insulating portion, a magnetoresistive read sensor, and a shield disposed adjacent the magnetoresistive read sensor. The shield includes an antiferromagnetic layer and at least one ferromagnetic layer disposed between the magnetoresistive read sensor and a distal boundary of the shield where the shield interfaces the non-magnetic insulating portion. All layers of the at least one ferromagnetic layer can have a combined thickness less than 500 angstroms.

In another embodiment, a magnetic head includes a magnetic resistive sensor means for reading data from a magnetic storage medium, and a shield means for magnetically shielding the sensor means. The shield means can include a non-magnetic means, a ferromagnetic means disposed between the magnetic resistive sensor means and the non-magnetic means, and an antiferromagnetic means for exchange coupling with the ferromagnetic means. The non-magnetic means can have a thickness between 500 angstroms (Å) and 1000 Å.

For yet a further embodiment, a method of forming a magnetic head includes depositing a non-magnetic insulating portion, depositing a magnetoresistive read sensor, and depositing a shield disposed adjacent the magnetoresistive read sensor. Depositing the shield can include depositing a ferromagnetic first layer, depositing an antiferromagnetic second layer, and depositing a non-magnetic third layer. Additionally, the non-magnetic third layer can define an outermost layer of the shield in contact with the non-magnetic insulating portion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a diagrammatic bottom view of a magnetic head, according to another embodiment of the invention.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Figure 1:
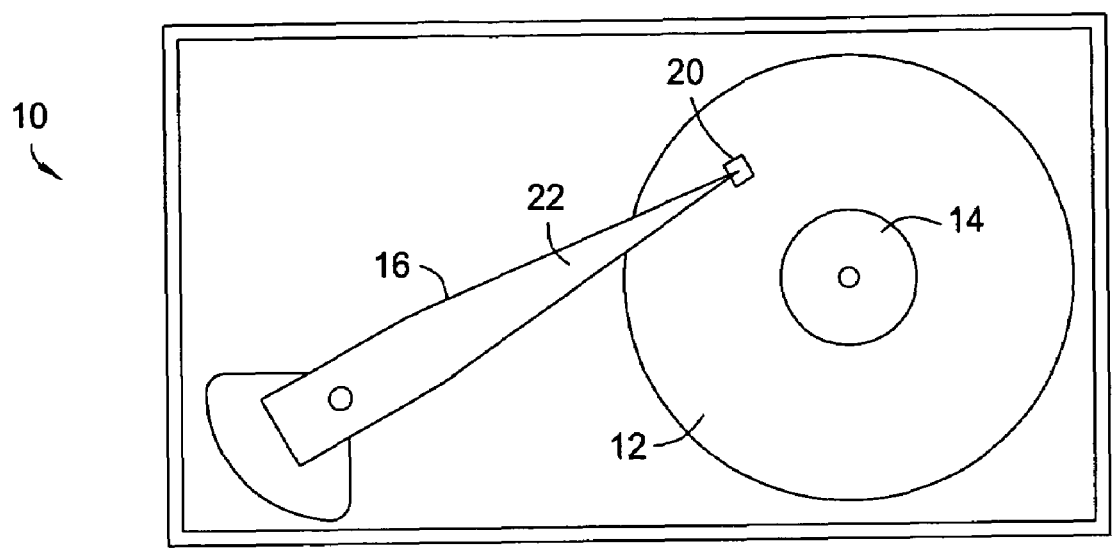
FIG. 1 is a top plan view of a hard disk drive including a magnetic head, according to embodiments of the invention.

FIG. 1 illustrates a hard disk drive 10 that includes a magnetic media hard disk 12 mounted upon a motorized spindle 14. An actuator arm 16 is pivotally mounted within the hard disk drive 10 with a magnetic head 20 disposed upon a distal end 22 of the actuator arm 16. During operation of the hard disk drive 10, the hard disk 12 rotates upon the spindle 14 and the magnetic head 20 acts as an air bearing slider adapted for flying above the surface of the disk 12. As described hereinafter, the magnetic head 20 includes a substrate base upon which various layers and structures that form the magnetic head 20 are fabricated. Thus, magnetic heads disclosed herein can be fabricated in large quantities upon a substrate and subsequently sliced into discrete magnetic heads for use in devices such as the hard drive 10.

Figure 2:
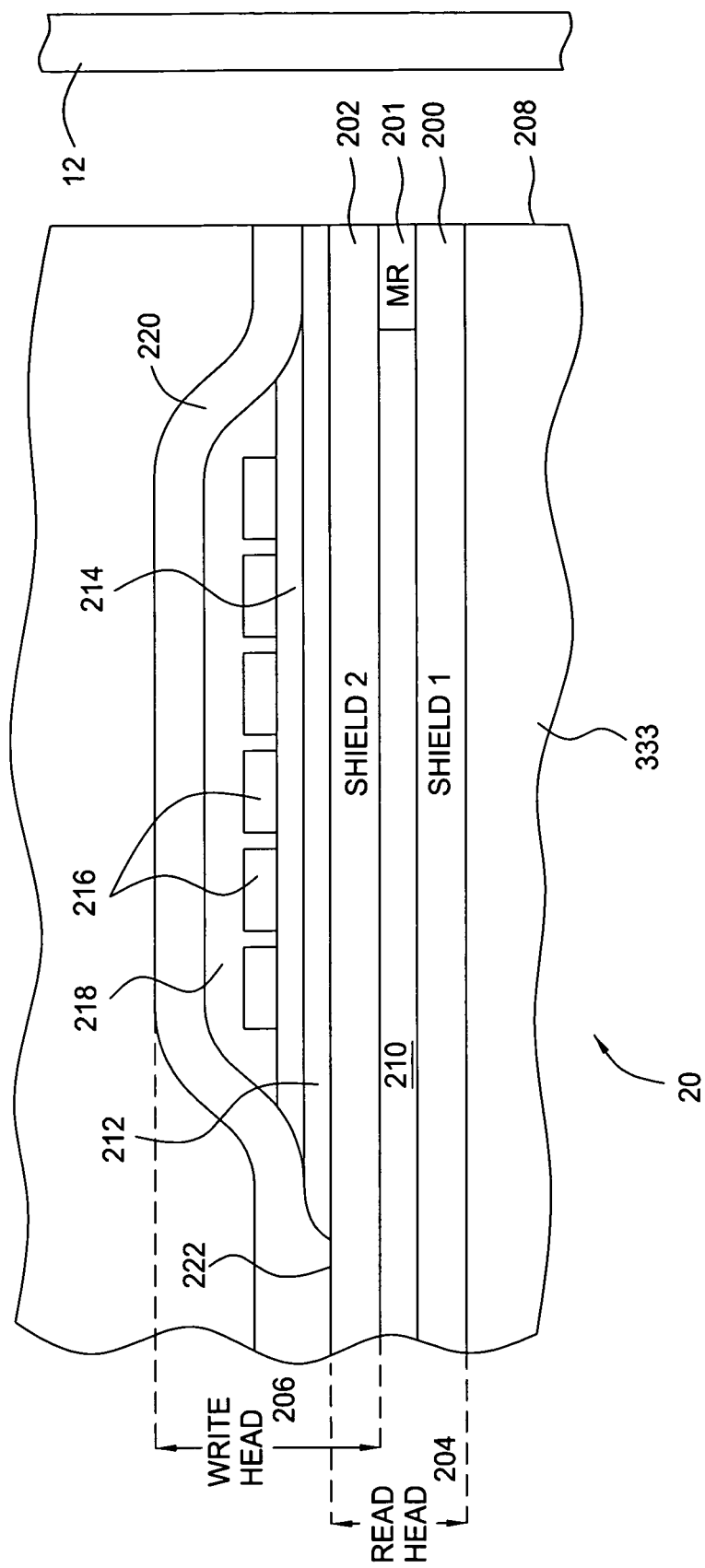
FIG. 2 is a cross-sectional, diagrammatic side view of the magnetic head, according to embodiments of the invention.

FIG. 2 shows a side diagrammatic cross-sectional elevation view of the magnetic head 20, which includes a read head portion 204 employing a magnetoresistive (MR) sensor 201. Additionally, the read head portion 204 includes first and second shields 200, 202 that the MR sensor 201 is sandwiched between. A spacer layer 210 disposed about the MR sensor 201 separates the first shield 200 from the second shield 202. Ends of the shields 200, 202 and the MR sensor 201 are polished to at least partially define an air bearing surface (ABS) 208. During operations, a thin cushion of air (e.g., 0.01 micrometers) between the disk 12 and the ABS 208 supports the head 20.

The magnetic head 20 can additionally include a write head portion 206 if desired to form a combination read and write head. The write head portion 206 of the magnetic head 20 includes a coil layer 216 sandwiched between first and second insulation layers 214, 218. The coil layer 216 and the first and second insulation layers 214, 218 are sandwiched between a first pole layer 220 and the second shield 202 that doubles as a second pole layer when the head 20 is a merged magnetic head. A back gap 222 magnetically couples the first pole layer 220 and the second shield 202 while a write gap layer 212 separates the first pole layer 220 and the second shield 202 at the ABS 208. For some embodiments, the second shield 202 can be separated by an insulation layer from a separate second pole layer to provide a piggyback head (not shown).

Figure 3:
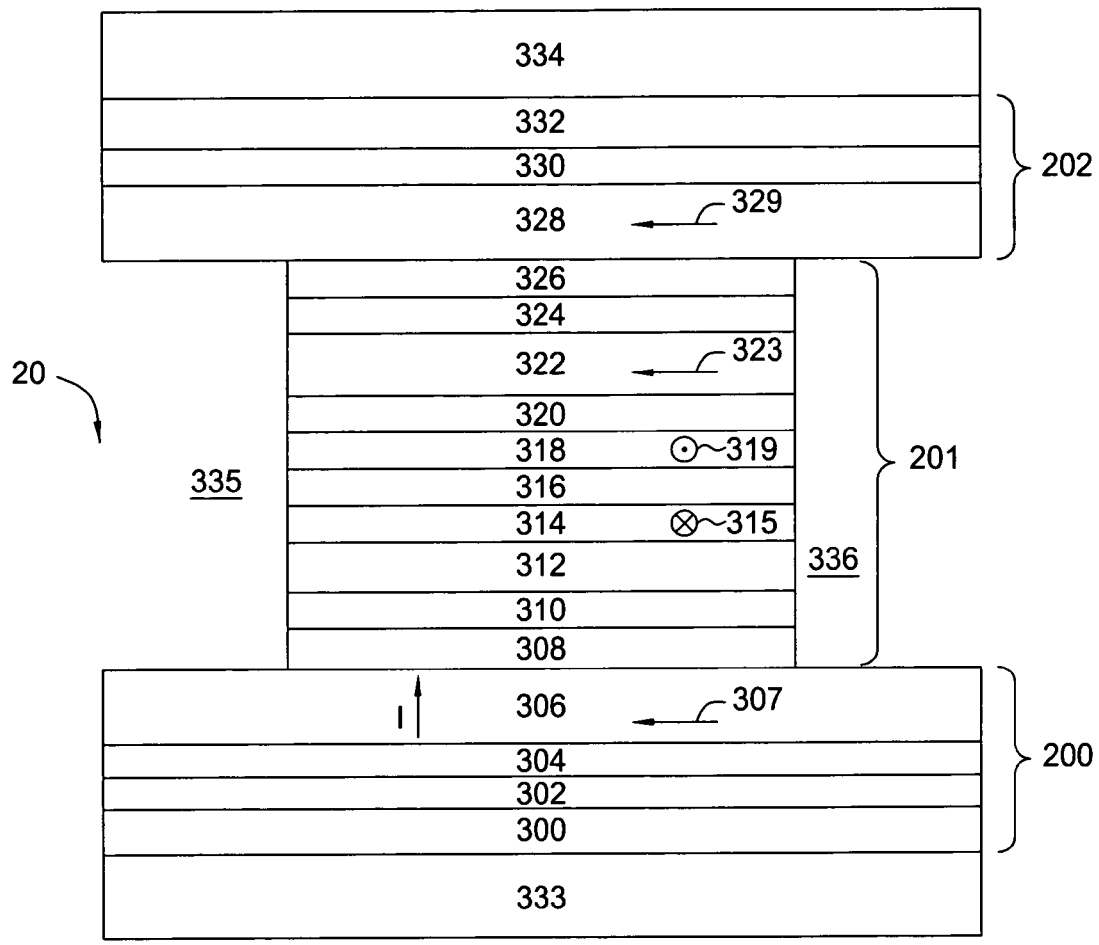
FIG. 3 is a diagrammatic bottom view of the magnetic head, according to embodiments of the invention.

FIG. 3 illustrates a diagrammatic bottom view of the magnetic head 20. First and second regions 335, 336 on either side of the MR sensor 201 typically include insulation layers, such as aluminum oxide ($Al_2O_3$), and hard bias layers that cause magnetic fields to extend longitudinally through the MR sensor 201 for stabilizing a free layer 322. The MR sensor 201 can define a current perpendicular to the plane (CPP) sensor or a current in plane (CIP) sensor. When the MR sensor 201 is configured as the CPP sensor, the shields 200, 202 can serve as first and second leads connected to processing circuitry (not shown) for conducting a current I through the MR sensor 201 perpendicular to major planes of the layers of the MR sensor 201, as shown in FIG. 3. The MR sensor 201 and the hard bias layers are located between the first and second shields 200, 202.

As an exemplary sensor configuration for use with the shields described herein, the MR sensor 201 includes a first tantalum (Ta) layer 308 deposited on the first shield 200 followed by a first ruthenium (Ru) layer 310 and a sensor antiferromagnetic (AFM) layer 312, such as iridium manganese (IrMn). An antiferromagnetic (AFC) coupling layer 316, such as Ru, separates first and second pinned layers 314, 318 disposed above the sensor AFM layer 312. The first pinned layer 314 can be a cobalt iron layer, such as CoFe25, while the second pinned layer 318 can be a cobalt iron boron (CoFeB) layer. The sensor AFM layer 312 can be exchange coupled to the first pinned layer 314 for pinning a magnetic moment 315 of the first pinned layer 314 in a direction either out of the head or into the head. By a strong antiparallel coupling between the magnetic moment 315 and a magnetic moment 319 of the second pinned layer 318, the direction of the magnetic moment 319 is antiparallel to the magnetic moment 315. Additionally, the MR sensor 201 includes an insulator (INS) layer 320, such as magnesium oxide (MgO), located between the second pinned layer 318 and the free layer 322. Further, a second Ta layer 324 and a second Ru layer 326 complete the MR sensor 201 prior to deposition of the second shield 202 onto the second Ru layer 326.

The free layer 322 provides a magnetic moment 323 directed from right to left or from left to right. When a field signal from a rotating magnetic disk rotates the magnetic moment 323 into the head, the magnetic moments 323 and 319 become more antiparallel increasing the resistance of the MR sensor 201 to the current (I). Alternatively, the magnetic moments 323 and 319 become more parallel to decrease the resistance of the MR sensor 201 when the field signal rotates the magnetic moment 323 out of the head. These resistance changes cause potential changes that are processed as playback signals.

For some embodiments, the first shield 200 is deposited onto a substrate base 333 of the magnetic head. The substrate base 333 can be a non-magnetic material such as $Al_2O_3$—TiC (alumina titanium carbide) and can include an undercoating, such as aluminum oxide ($Al_2O_3$), deposited prior to deposition of the first shield 200. A first non-magnetic layer 300 is formed onto the substrate base 333. The first non-magnetic layer 300 can be either Ta or rhodium (Rh) or a combination of these materials in separate layers as illustrated in FIG. 4. Since Ta and Rh have relatively small thermal coefficients of expansion, the first non-magnetic layer 300 can be thicker without tending to protrude from the ABS 208 as temperature increases. For example, the first non-magnetic layer 300 can be between 500 angstroms (Å) and 1000 Å.

The first shield 200 additionally includes a seed layer 302, a first antiferromagnetic (AFM) layer 304 and a first ferromagnetic (FM) layer 306. The seed layer 302 can be about 15 Å and can include nickel iron chromium (NiFeCr) and/or nickel iron (NiFe) or Ru. The first AFM layer 304 of the first shield 200 can be IrMn and can have a thickness of 50 Å to 75 Å. Other antiferromagnetic materials such as palladium manganese (PdMn) or nickel manganese (NiMn) can also be used for the AFM layer 304. The first AFM layer 304 induces an exchange coupling between the first AFM layer 304 and the first ferromagnetic layer 306 formed on the first AFM layer 304. Therefore, the first AFM layer 304 fixes the direction of a magnetization 307 of the first ferromagnetic layer 306 substantially in a direction directed from right to left or from left to right.

The first ferromagnetic layer 306 can be a NiFe alloy or cobalt iron (CoFe) and can have a thickness of less than 500 Å. For some embodiments, the thickness of the first ferromagnetic layer 306 is between 100 Å and 500 Å. The exchange coupling between the first AFM layer 304 and the first ferromagnetic layer 306 stabilizes a magnetic domain configuration of the first ferromagnetic layer 306. Accordingly, the first ferromagnetic layer 306 is as magnetically stiff as a much thicker ferromagnetic layer lacking the exchange coupling. This stability assures that the first ferromagnetic layer 306 does not saturate with an applied external field and that a return to the desired magnetic domain configuration of the first ferromagnetic layer 306 occurs upon relaxation of the external magnetic field. Further, the layers 300, 302, 304, 306 of the first shield 200 together with the second shield 202 provide substantially all the shielding for the MR sensor 201.

In addition to a small thickness of the first ferromagnetic layer 306 aiding in reducing an extent of thermal expansion of the first shield 200, the small thickness enables more flexibility in selecting a composition of the ferromagnetic material within the first shield 200. Thick films normally require plating to deposit a desired layer while thin films permit use of sputtering. For some embodiments, the first ferromagnetic layer 306 can include sendust (FeSiAl) or iron nitride (FeN). The first ferromagnetic layer 306 according to some embodiments can include a first sputtering of CoFe followed by a second sputtering of NiFe to improve magnetic coupling with the first AFM layer 304 since CoFe provides a larger exchange constant than NiFe.

After completing deposition of the first shield 200, the MR sensor 201 can be deposited onto the first ferromagnetic layer 306. The second shield 202 can be formed on top of the second Ru layer 326 of the MR sensor 201. For some embodiments, the second shield 202 includes a second ferromagnetic layer 328, a second AFM layer 330 and a second non-magnetic layer 332, which can be analogous to corresponding ones of the layers 300, 304, 306 of the first shield 200.

Accordingly, the second ferromagnetic layer 328 can include NiFe/CoFe and can have a thickness of less than 500 Å. Additionally, the second AFM layer 330 of the second shield 202 can include IrMn and can have a thickness of 50 Å to 75 Å. The second AFM layer 330 fixes the direction of a magnetization 329 of the second ferromagnetic layer 328 substantially in a direction directed from right to left or from left to right. Similar to the first shield 200, exchange coupling between the second AFM layer 330 and the second ferromagnetic layer 328 magnetically stabilizes the second shield 202. Furthermore, the second non-magnetic layer 300 can be between 500 Å and 1000 Å and can include Ta/Rh.

An encapsulation layer 334, such as Al$_2$O$_3$, disposed on the second non-magnetic layer 332 provides a coating on the second shield 202. The encapsulation layer 334 can provide a magnetic gap utilized by the write head portion 206 that can be disposed on the second shield 202, such as illustrated in FIG. 2. For example, the encapsulation layer 334 can function as the write gap layer 212 to separate the first pole layer 220 and the second shield 202 adjacent the ABS 208. For some embodiments, the encapsulation layer 334 separates the second shield 202 from a separate write head of a piggyback head since the separate write head can be deposited directly onto the encapsulation layer 334. When the shields 200, 202 and the MR sensor 201 are part of a read only head, the encapsulation layer 334 can define an outermost layer that remains exposed.

Magnetic setting of all the AFM layers 304, 312, 330 can occur in a single setting process. The setting process can include heat treatment while applying a magnetic field (e.g., 10,000 oersted (Oe)) perpendicular to the substrate base 333 (i.e., the direction of the magnetic moment 315). Thus, the direction of the magnetic moment 315 of the first pinned layer 314 of the MR sensor 201 fixes in the direction of the applied magnetic field by exchange coupling with the sensor AFM layer 312. Subsequently, the magnetic field applied is decreased and its direction changed to a direction parallel to the substrate base 333 (i.e., the direction of the magnetic moments 307, 329). This lower magnetic field (e.g., 1000 Oe) induces exchange coupling between the first ferromagnetic layer 306 and the first AFM layer 304 of the first shield 200 and exchange coupling between the second ferromagnetic layer 328 and the second AFM layer 330 of the second shield 202 without effecting the pinned layers 314, 318 since the pinned layers 314, 318 are magnetically stiff due to the antiferromagnetic coupling provided by the AFC layer 316.

Each of the ferromagnetic layers 306, 328 represent substantially all of the ferromagnetic material in each of the shields 200, 202, respectively. Accordingly, a total thickness of ferromagnetic material within each of the shields can be less than 500 angstroms to limit the amount of expansion differential that occurs between the MR sensor 201 and the shields 200, 202 as the temperature of the magnetic head 20 increases. The foregoing embodiment(s) is merely exemplary. Persons skilled in the art will recognize other embodiments within the scope of the present invention. For example, other embodiments can divide the first ferromagnetic layer 306 into two layers disposed on each side of the first AFM layer 304, as described below.

FIG. 4 shows a diagrammatic bottom view of a magnetic head 420 according to another embodiment of the invention. The head 420 includes a first shield 400, a MR sensor 401 and a second shield 402. A first conductor layer 450 is formed onto a substrate base of the head 420. The first conductor layer 450 can be Rh with a thickness of about 500 Å. A first non-magnetic layer 452 is formed onto the first conductive layer 450. The first non-magnetic layer 452 can be Ta and can have a thickness of about 30 Å.

The first shield 400 additionally includes a seed layer 454, a first ferromagnetic layer 456, a first AFM layer 458 and a second ferromagnetic layer 460. The seed layer 454 can be about 15 Å and can include NiFeCr/NiFe or Ru. The first and second ferromagnetic layers 456, 460 can include NiFe/CoFe and can each have a thickness of less than 250 Å. The first AFM layer 458 can include IrMn and can have a thickness of 50 Å to 75 Å. The first AFM layer 458 fixes the direction of a magnetization 457 of the first ferromagnetic layer 456 and a magnetization 461 of the second ferromagnetic layer 460 substantially in a direction directed from right to left or from left to right.

Magnetic coupling of the ferromagnetic material within the first shield 400 with the first AFM layer 458 depends on amount of surface area of the ferromagnetic material in contact with the first AFM layer 458. Advantageously, the first and second ferromagnetic layers 456, 460 enable contact with two faces of the first AFM layer 458. Therefore, the first and second ferromagnetic layers 456, 460 disposed on both sides of the first AFM layer 458 enhance stability of the first shield 400.

After completing deposition of the first shield 400, the MR sensor 401 can be deposited onto the second ferromagnetic layer 460 followed by the second shield 402. For some embodiments, the second shield 402 includes a third ferromagnetic layer 462, a second AFM layer 464, a fourth ferromagnetic layer 466, a second non-magnetic layer 468 and a second conductor layer 470 that can all be analogous to corresponding layers of the first shield 400. Hence, the third and fourth ferromagnetic layers 462, 466 can include NiFe/CoFe and can each have a thickness of less than 250 Å. The second AFM layer 464 can include IrMn and can have a thickness of 50 Å to 75 Å. The second AFM layer 464 fixes the direction of a magnetization 463 of the third ferromagnetic layer 462 and a magnetization 467 of the fourth ferromagnetic layer 466 substantially in a direction directed from right to left or from left to right.

Furthermore, the second non-magnetic layer 468 can be about 30 Å and can include Ta. The second conductor layer 470 can include Rh and have a thickness of about 500 Å. For configurations where the second shield 402 is not exposed, an encapsulation layer (not shown) can be disposed on the second shield 402, as described above.

All of the embodiments disclosed herein can have a total thickness of ferromagnetic material within each of the shields less than 500 angstroms to limit the amount of expansion differential that occurs between the MR sensor and the shields as the temperature of the magnetic head increases. Accordingly, protrusion of the shields at the air bearing surface is at least reduced. The shields disclosed herein maintain magnetic stiffness/stability even with the thickness of the ferromagnetic material within each of the shields being less than 500 angstroms due to exchange coupling with an AFM layer.

While the foregoing is directed to embodiments of the present invention, other and further embodiments of the invention may be devised without departing from the basic scope thereof, and the scope thereof is determined by the claims that follow.

What is claimed is:

1. A magnetic head, comprising:
   a non-magnetic insulating portion;
   a magnetoresistive read sensor; and
   a shield disposed adjacent the magnetoresistive read sensor, wherein the shield comprises a ferromagnetic first layer, an antiferromagnetic second layer, a non-magnetic third layer, wherein the non-magnetic third layer defines an outermost conductive layer of the shield in contact with the non-magnetic insulating portion, and a ferromagnetic fourth layer, wherein
   the ferromagnetic first layer is less than about 500 angstroms and contacts the antiferromagnetic second layer for exchange coupling;
   the ferromagnetic fourth layer contacts the antiferromagnetic second layer for exchange coupling; and
   the ferromagnetic first and fourth layers sandwich the antiferromagnetic second layer.

2. The magnetic head of claim 1, wherein a surface defined by the magnetoresistive read sensor and the shield is an air bearing surface.

3. The magnetic head of claim 1, wherein the non-magnetic insulating portion comprises aluminum oxide ($Al_2O_3$).

4. The magnetic head of claim 1, wherein a total thickness of ferromagnetic material within the shield is less than 500 angstroms.

5. The magnetic head of claim 1, wherein the shield defines a conductor in contact with the magnetoresistive read sensor for passing a current through the magnetoresistive read sensor.

6. The magnetic head of claim 1, wherein the shield further comprises a seed layer disposed between the antiferromagnetic second layer and the non-magnetic third layer.

7. The magnetic head of claim 6, wherein the seed layer is disposed on and in contact with the non-magnetic third layer, the ferromagnetic fourth layer is disposed on and in contact with the seed layer, the antiferromagnetic second layer is disposed on and in contact with the ferromagnetic fourth layer, the ferromagnetic first layer is disposed on and in contact with the antiferromagnetic second layer, and the magnetoresistive read sensor is disposed on and in contact with the ferromagnetic first layer.

8. The magnetic head of claim 6, wherein the seed layer has a thickness of about 15 angstroms and is selected from at least one of nickel iron chromium (NiFeCr), nickel iron (NiFe), and ruthenium (Ru).

9. The magnetic head of claim 1, wherein the ferromagnetic first layer is disposed on and in contact with the magnetoresistive read sensor, the antiferromagnetic second layer is disposed on and in contact with the ferromagnetic first layer, the ferromagnetic fourth layer is disposed on and in contact with the antiferromagnetic second layer, and the non-magnetic third layer is disposed on and in contact with the ferromagnetic fourth layer.

10. The magnetic head of claim 1, wherein the non-magnetic third layer comprises tantalum (Ta) and rhodium (Rh).

11. The magnetic head of claim 1, wherein the non-magnetic insulating portion separates the shield from a pole of a write head disposed on the non-magnetic insulating portion.

12. The magnetic head of claim 1, wherein the non-magnetic insulating portion includes an aluminum oxide ($Al_2O_3$) undercoating on an $Al_{23}$—TiC (alumina titanium carbide) body.

13. A magnetic head, comprising:
    a non-magnetic insulating portion;
    a magnetoresistive read sensor; and
    a shield disposed adjacent the magnetoresistive read sensor, wherein the shield comprises an antiferromagnetic layer and at least one ferromagnetic layer disposed between the magnetoresistive read sensor and a distal boundary of the shield where the shield interfaces the non-magnetic insulating portion;
    wherein the at least one ferromagnetic layer comprises a first ferromagnetic layer that contacts a first side of the antiferromagnetic layer for exchange coupling and a second ferromagnetic layer that contacts a second side opposite the first side of the antiferromagnetic layer for exchange coupling and all layers of the at least one ferromagnetic layer have a combined thickness less than 500 angstroms.

14. The magnetic head of claim 13, wherein the shield further comprises a non-magnetic layer selected from at least one of tantalum (Ta) and rhodium (Rh) and having a thickness between 500 angstroms (Å) and 1000 Å.

15. The magnetic head of claim 13, wherein the first and second ferromagnetic layers are the only ferromagnetic layers between the magnetoresistive read sensor and the distal boundary.

16. A magnetic head, comprising:
    a magnetic resistive sensor means for reading data from a magnetic storage medium; and
    a shield means for magnetically shielding the sensor means, wherein the shield means comprises:
       a non-magnetic conductive means, wherein the non-magnetic conductive means has a thickness between 500 angstroms (Å) and 1000 Å;

a ferromagnetic means disposed between the magnetic resistive sensor means and the non-magnetic conductive means;

an antiferromagnetic means for exchange coupling with the ferromagnetic means.

17. The magnetic head of claim 16, wherein the ferromagnetic means has a thickness less than 500 Å.

18. The magnetic head of claim 16, wherein the non-magnetic conductive means defines a distal boundary of the shield means where the shield means interfaces with an insulating means.

19. A method of forming a magnetic head, comprising:

providing a non-magnetic insulating portion;

depositing a shield on the non-magnetic insulating portion, wherein depositing the shield comprises depositing a ferromagnetic first layer, depositing an antiferromagnetic second layer, depositing a non-magnetic third layer, wherein the non-magnetic third layer defines an outermost layer of the shield in contact with the non-magnetic insulating portion, and depositing a ferromagnetic fourth layer; wherein the ferromagnetic first layer is less than about 500 angstroms and contacts the antiferromagnetic second layer for exchange coupling; wherein the ferromagnetic fourth layer contacts the antiferromagnetic second layer for exchange coupling; and wherein the ferromagnetic first and fourth layers sandwich the antiferromagnetic second layer; and depositing a magnetoresistive read sensor on the shield.

20. The method of claim 19, wherein a first thickness of the shield, relative to a second thickness of the sensor, is selected to reduce protrusion of the shield relative to the sensor with increasing temperature.

* * * * *